(12) United States Patent
Akai et al.

(10) Patent No.: US 8,314,340 B2
(45) Date of Patent: Nov. 20, 2012

(54) MULTILAYER PRINTED WIRING BOARD AND METHOD FOR MANUFACTURING MULTILAYER PRINTED WIRING BOARD

(75) Inventors: Sho Akai, Ibi-gun (JP); Tatsuya Imai, Ibi-gun (JP); Iku Tokihisa, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 326 days.

(21) Appl. No.: 12/568,512

(22) Filed: Sep. 28, 2009

(65) Prior Publication Data

US 2010/0122839 A1  May 20, 2010

Related U.S. Application Data

(60) Provisional application No. 61/101,401, filed on Sep. 30, 2008.

(51) Int. Cl.
*H05K 1/03* (2006.01)

(52) U.S. Cl. ........ 174/255; 174/256; 174/257; 174/258; 174/261; 174/263; 361/760; 361/762; 361/764; 361/765; 361/782; 257/734; 257/750; 257/780; 438/96; 438/156; 438/209; 438/622; 29/623.5; 29/832

(58) Field of Classification Search .......... 174/255–258, 174/261, 263; 361/760, 762, 764, 765, 782; 257/734, 750, 780; 438/96, 156, 209, 622; 29/623.5, 832
See application file for complete search history.

(56) References Cited

U.S. PATENT DOCUMENTS

| | | | |
|---|---|---|---|
| 6,518,087 B1 * | 2/2003 | Furusawa et al. | 438/96 |
| 6,534,723 B1 * | 3/2003 | Asai et al. | 174/255 |
| 7,957,154 B2 * | 6/2011 | Ito et al. | 361/765 |
| 2001/0004133 A1 * | 6/2001 | Ihara | 257/750 |
| 2004/0161593 A1 | 8/2004 | Yamazaki et al. | |
| 2005/0157478 A1 * | 7/2005 | Inagaki et al. | 361/763 |
| 2007/0205520 A1 * | 9/2007 | Chou et al. | 257/780 |
| 2008/0055872 A1 * | 3/2008 | Inagaki et al. | 361/760 |
| 2010/0126758 A1 * | 5/2010 | Akai et al. | 174/257 |

FOREIGN PATENT DOCUMENTS

| | | |
|---|---|---|
| CN | 1849042 A | 10/2006 |
| EP | 1 102 523 A1 | 5/2001 |
| EP | 1 137 332 A1 | 9/2001 |
| EP | 1 040 892 B1 | 6/2003 |
| EP | 1 940 209 A2 | 7/2008 |
| JP | 59-25297 | 2/1984 |
| JP | 2-19994 | 5/1990 |
| JP | 3-268385 | 11/1991 |
| JP | 2000-315854 | 11/2000 |
| JP | 2000-340948 | 12/2000 |
| JP | 2001-144446 | 5/2001 |
| JP | 2003-318519 | 11/2003 |
| JP | 2007-116191 | 5/2007 |

* cited by examiner

*Primary Examiner* — Xiaoliang Chen

(74) *Attorney, Agent, or Firm* — Oblon, Spivak, McClelland, Maier & Neustadt, L.L.P.

(57) ABSTRACT

A multilayer printed wiring board including a first interlayer resin insulation layer, a pad formed on the first interlayer resin insulation layer, a solder resist layer formed on the first interlayer resin insulation layer and the pad, a protective film formed on a portion of the pad exposed by an opening of the solder resist layer, and a coating layer formed between the pad and the solder resist layer. The pad mounts an electronic component. The coating layer has a metal layer and a coating film. The metal layer is formed on the surface of the pad and the coating film is formed on the metal layer.

20 Claims, 6 Drawing Sheets

MULTILAYER PRINTED WIRING BOARD AND METHOD FOR MANUFACTURING MULTILAYER PRINTED WIRING BOARD

CROSS-REFERENCE TO RELATED APPLICATIONS

The present application claims the benefits of priority to U.S. Application No. 61/101,401, filed Sep. 30, 2008. The contents of that application are incorporated herein by reference in their entirety.

BACKGROUND OF THE INVENTION

1. Field of the Invention

The present invention is related to a multilayer printed wiring board and a method for manufacturing a multilayer printed wiring board.

2. Discussion of the Background

To enhance the adhesiveness between copper and resin, a method in which the surface of copper is roughened (roughened surface) to improve the adhesiveness between copper and resin through an anchoring effect is suggested. Also, another method is suggested to improve the adhesiveness between copper and resin by forming a metal film made of a copper-tin alloy on the copper surface (for example, see Japanese Laid-Open Patent Publication 2000-340948.). The contents of this publication are incorporated herein by reference in their entirety.

SUMMARY OF THE INVENTION

According to one aspect of the present invention, a multilayer printed wiring board includes a first interlayer resin insulation layer, a pad formed on the first interlayer resin insulation layer, a solder resist layer formed on the first interlayer resin insulation layer and the pad, a protective film formed on a portion of the pad exposed by an opening of the solder resist layer, and a coating layer formed between the pad and the solder resist layer. The pad mounts an electronic component. The coating layer has a metal layer and a coating film. The metal layer is formed on the surface of the pad and the coating film is formed on the metal layer.

According to another aspect of the present invention, a method for manufacturing a multilayer printed wiring board includes forming interlayer resin insulation layers and conductive circuits formed on the interlayer resin insulation layers, forming a pad for mounting an electronic component on the outermost interlayer resin insulation layer, forming on the pad a coating layer which includes a metal layer formed on the surface of the pad and a coating film formed on the metal layer, forming a solder resist layer on the outermost interlayer resin insulation layer and the pad, forming an opening in the solder resist layer exposing a portion of the pad coated with the coating layer, removing a portion of the coating layer exposed by the opening of the solder resist layer, and forming a protective film on the portion of the pad exposed by the opening of the solder resist layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

Figure 1:
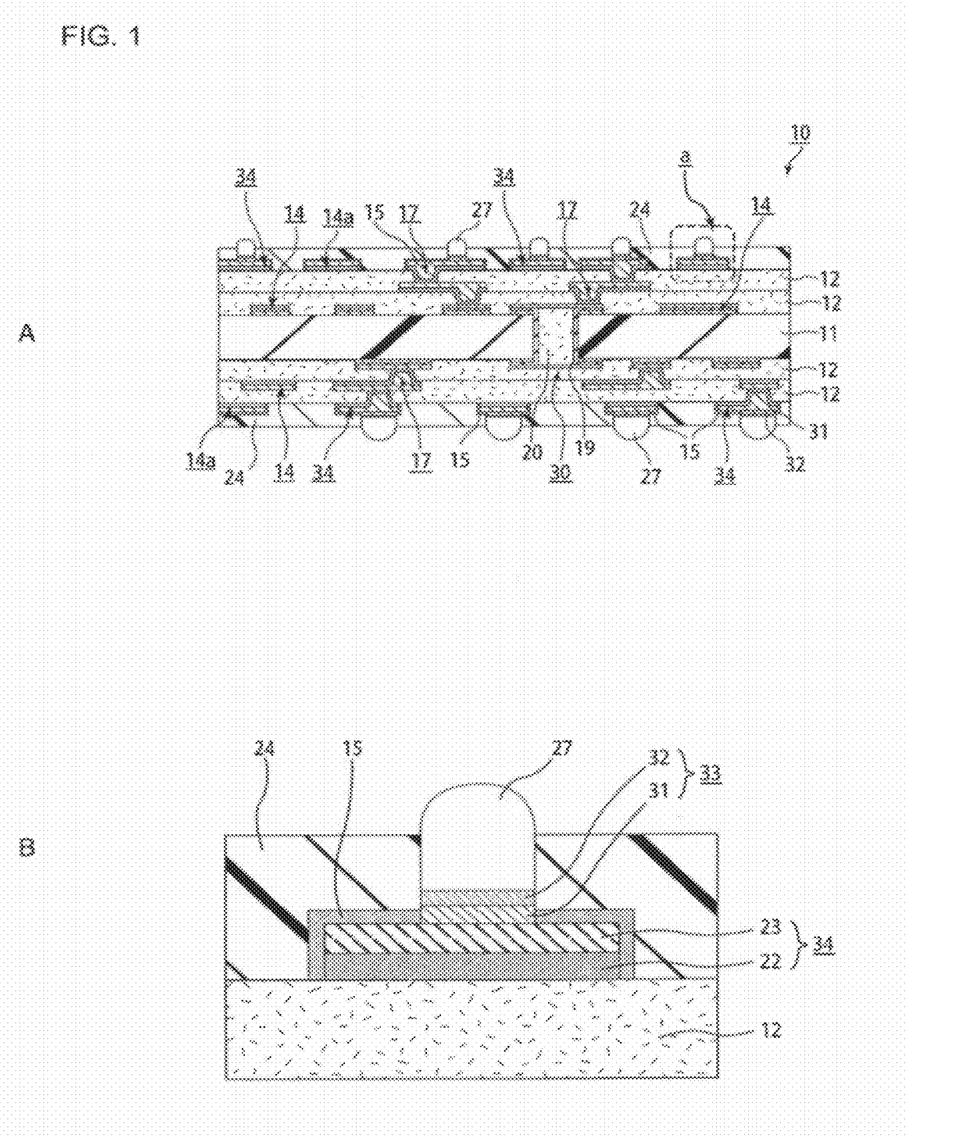
FIG. 1A is a cross-sectional view schematically showing a multilayer printed wiring board of an embodiment.
FIG. 1B is a partially magnified cross-sectional view showing region (a) of the multilayer printed wiring board shown in FIG. 1A.

FIG. 1A is a cross-sectional view schematically showing a multilayer printed wiring board according to an embodiment. FIG. 1B is a partially magnified cross-sectional view showing region (a) of the multilayer printed wiring board in FIG. 1A. In multilayer printed wiring board 10 of the embodiment shown in FIGS. 1A and 1B, conductive circuits 14 and interlayer resin insulation layers 12 are alternately laminated on both surfaces of insulative substrate 11, and conductive circuits 14 formed on the surfaces of insulative substrate 11 are electrically connected by means of through-holes 19. Also, conductive circuits 14 sandwiching interlayer resin insulation layer 12 are electrically connected through via conductors 17. In addition, on the outermost interlayer resin insulation layer, conductive circuit 14 is formed along with solder pad 34 for mounting an electronic component. Here, solder pad 34 and outermost conductive circuit (14a) are formed the same way.

Also, resin filler layer 20 is formed in through-hole conductors 19, and conductive circuit 30 is formed to cover resin filler layer 20. On the outermost layer of the multilayer printed wiring board, solder resist layer 24 is formed. On part of solder pad 34 positioned at the bottom of an opening portion formed in solder resist layer 24, solder bump 27 is formed by means of protective film 33.

Here, on part of the side and top surfaces of solder pad 34, a metal layer containing Sn is formed, and a coating film made of a silane coupling agent is further formed on the metal layer (hereinafter, such a metal layer and a coating film on the metal layer are altogether referred to as a conductive-circuit coating layer, and indicated as conductive-circuit coating layer 15 in FIGS. 1A and 1B). Namely, solder pad 34 and solder resist layer 24 are adhered by means of conductive-circuit coating layer 15. Conductive-circuit coating layer 15 is also formed on the side and top surfaces of outermost-layer conductive circuit (14a), which is formed the same way as solder pad 34. On areas of the outermost conductive circuit where solder pads are not formed (areas of the conductive circuit without solder bumps), conductive-circuit coating layer 15 is formed on the entire surfaces excluding the surface that makes contact with the interlayer resin insulation layer.

Also, as shown in FIG. 1B, solder pad 34 is made up of electroless copper-plated film 22 and electrolytic copper-plated film 23 on electroless copper-plated film 22. Furthermore, on part of its surfaces (on the side and top surfaces of solder pad 34, areas excluding the portion that makes contact with protective film 33), a metal layer and a coating film made of a coupling agent formed on the metal layer (conductive-circuit coating layer 15) are formed. In the present specification, the top surface of solder pad 34 and the top surface of outermost-layer conductive circuit (14a) indicate the side where a solder resist layer is formed. Also, on solder pad 34, protective film 33 is formed, which is made up of Ni layer 31 and Au layer 32. Protective film 33 is directly connected to electrolytic copper-plated film 23 which forms solder pad 34. Namely, on part of the top surface of solder pad 34 where protective film 33 is formed, there is no metal film or coating film.

As so described, on predetermined portions of the top and side surfaces of solder pad 34, a metal layer containing Sn is formed and a coating film made of a silane coupling agent is formed on the metal layer. Accordingly, solder pad 34 and solder resist layer 24 strongly adhere by means of the metal layer and the coating film (conductive-circuit coating layer 15). A more detailed description regarding such is provided below.

In multilayer printed wiring board 10 shown in FIGS. 1A and 1B, the metal layer containing Sn formed on the surface of solder pad 34 is a layer formed with an Sn—Cu compound metal. Specifically, the metal layer contains $Cu_6Sn_5$ and $Cu_3Sn$. Then, when the metal layer is formed, hydroxyl groups are thought to be adhered to its surface. If hydroxyl groups are adhered to the surface of the metal layer, they react easily with a silane coupling agent through dehydration reactions. Accordingly, the metal layer and the coating film of a silane coupling agent bond securely. Moreover, the above silane coupling agent reacts with the resin ingredient of interlayer resin insulation layer 12 to be chemically bonded. Accordingly, the coating film and solder resist layer 24 bond securely. As a result, solder pad 34 and solder resist layer 24 adhere strongly by means of the metal layer and the coating film.

As such, in an embodiment of the present invention, a metal layer formed on the surface of a solder pad is preferred to be a metal layer containing Sn. The reason is thought to be as follows: Namely, a metal layer containing Sn is more suitable for adhering hydroxyl groups to its surface than Cu, which forms solder pads; and if hydroxyl groups are adhered, the metal easily bonds with a coupling agent. In addition, the reason for a layer containing Sn to adhere hydroxyl groups more easily to its surface than a layer containing Cu is thought to be that the isoelectric point of an Sn oxide ($SnO_2$) is 4.3, which is lower than the isoelectric point 9.5 of a Cu oxide (CuO). Generally, a metal oxide with a low isoelectric point tends to adhere hydroxyl groups easily to its surface. Considering such, a multilayer printed wiring board according to an embodiment of the present invention is preferred to use for its metal layers a metal whose oxide has an isoelectric point of 5 or less.

In a multilayer printed wiring board of the present embodiment, a metal layer is formed on a solder pad made of copper by performing tin displacement plating as described later in a manufacturing method. The above metal layer contains Sn and Cu. Furthermore, when forming a metal layer, parts of Sn and Cu are oxidized inevitably, thus it is thought that $SnO_2$ and CuO are contained in the metal layer.

Also, in multilayer printed wiring board 10, the top surface of solder pad 34 and the entire surface of protective film 33 are directly connected. As such, if there is no metal layer or coating film between solder pad 34 and protective film 33, their electrical resistance decreases and excellent electrical characteristics are achieved, compared with a case having a metal layer and a coating film between them. Furthermore, in multilayer printed wiring board 10, the surface of solder pad 34 is not roughened and thus is substantially flat. Accordingly, signal transmissions are seldom delayed.

Next, a method for manufacturing a multilayer printed wiring board according to the embodiment is described in the order of steps.

(1) An insulative substrate is prepared as a starting material, and then conductive circuits are formed on the insulative substrate. The above insulative substrate is not limited to any specific type, but, for example, glass-epoxy substrates, bis-maleimide-triazine (BT) resin substrates, copper-clad laminates, resin substrates such as an RCC substrate, ceramic substrates such as an aluminum nitride substrate, silicon substrates and others may be used. The conductive circuits may be formed, for example, as follows: electroless copper plating is performed on the surfaces of the insulative substrate, then electrolytic copper plating or the like is performed to form a plain conductive layer made of copper, which is then etched. In this step, through-hole conductors may be formed to connect the conductive circuits sandwiching the insulative substrate. Also, after the conductive circuits are formed, the surfaces of the conductive circuits may be roughened through etching or the like, according to requirements.

(2) Next, on the insulative substrate with conductive circuits, interlayer insulation layers are formed, and then opening portions are formed in the interlayer insulation layers to reach the conductive circuits. The interlayer resin insulation layers are formed using a thermosetting resin, a photosensitive resin, a thermosetting resin part of which is photosensitive, and a resin compound of such resins and thermoplastic resin. Specifically, the resin layers are formed by applying an uncured resin using a roll coater, curtain coater or the like, by thermopressing a resin film and so forth. After that, according to requirements, the resin is cured, and the above openings are formed through laser processing or by exposure and development. In addition, resin layers made of the above thermoplastic resin may be formed by thermopressing resin films.

(3) Next, electroless copper-plated film is formed on the surfaces of the interlayer resin insulation layers (including the wall surfaces of the opening portions). Here, the thickness of the electroless copper-plated film is preferred to be set in the range of 0.1 to 0.3 μm.

(4) Next, a plating resist is formed on the electroless copper-plated film. The plating resist is formed in areas where conductive circuits and via conductors are not formed. Forming a plating resist is not limited to a specific method. For example, it may be formed by laminating a photosensitive dry film and then exposing it to light and developing it.

(5) Next, electrolytic copper-plated film is formed in areas of the electroless copper-plated film where the plating resist is not formed. Here, the thickness of the electrolytic copper-plated film is preferred to be set in the range of 5 to 20 μm.

(6) After that, the plating resist on the interlayer resin insulation layer is removed. To remove the plating resist, for example, an alkaline solution or the like may be used.

(7) Next, the electroless copper-plated film, exposed by removing the plating resist, is removed. Here, the electroless copper-plated film may be removed using, for example, an etching solution. Unnecessary parts of the electroless copper-plated film (such as those between portions of the electrolytic plated film) may be removed completely.

By conducting steps (2)-(7), a conductive circuit may be formed on the interlayer insulation layer, while forming via conductors which connect such a conductive circuit and the conductive circuit on the insulative substrate. Accordingly, conductive circuits and via conductors may be formed efficiently. Also, after forming the conductive circuit, if necessary, the catalyst on the interlayer resin insulation layer may be removed using acid or an oxidizer. Deterioration of electrical characteristics may be prevented.

(8) Moreover, by repeating the above steps (2)-(7) according to requirements, interlayer resin insulation layers and conductive circuits are further formed along with via conductors.

Also, among the conductive circuits formed through such a process, the outermost-layer conductive circuit, partially or entirely, becomes solder pads. Therefore, by forming the outermost-layer conductive circuit, solder pads are formed simultaneously.

(9) Next, on the entire exposed surfaces (side and top surfaces) of solder pads, a metal layer containing Sn is formed. The metal layer containing Sn may be formed by, for example, tin displacement plating, electroless tin plating, electrolytic tin plating, immersion in a molten-tin bath or the like. Among those, tin displacement plating is preferred, since the thickness of the plated film may be easily adjusted. As for the plating solution used in such tin displacement plating, for example, a mixed solution of tin bistetrafluoroborate and thiourea or the like is listed. When tin displacement plating is performed on solder pads made of copper, a layer made of Sn (hereinafter also referred to as an Sn layer) and an Sn—Cu compound layer (hereinafter also referred to as an Sn—Cu layer) are formed in that order from the surface-layer side. In addition, after forming metal layers in such a method, the Sn layer may be removed by etching to expose the Sn—Cu layer, according to requirements. The remaining Sn—Cu layer forms the metal layer. Here, the step to remove the Sn layer is optional.

Also, hydroxyl groups are adhered to the surface of the metal layer formed as above. The reason for hydroxyl groups to easily adhere to a metal layer containing Sn is as described above. Such hydroxyl groups adhere to a metal layer through water molecules attached to the metal surface without any specific treatment. However, hydroxyl groups may also be applied to a metal layer surface by means of a specific treatment. As for the first method to apply hydroxyl groups to a metal layer surface, for example, a method is listed in which the surfaces of solder pads are treated using metal alkoxide. As for such metal alkoxide, sodium methoxide ($CH_3ONa$), sodium ethoxide ($C_2H_5ONa$), lithium ethoxide ($C_2H_5OLi$) or the like are listed. Hydroxyl groups may be adhered by immersing the printed wiring board in a metal alkoxide solution, or by spraying such a solution on the surfaces of the solder pads. Also, as for the second method, for example, a method is listed in which the surfaces of conductive circuits are treated by an alkali. As for the above alkali, for example, sodium hydroxide, potassium hydroxide, sodium methoxide or the like are listed. Hydroxyl groups may be adhered by immersing the printed wiring board in such an alkaline solution, or by spraying such an alkaline solution on the surfaces of the solder pads. Furthermore, as for the third method, for example, a humidifying treatment or a steam treatment may be conducted on the solder pads. In the present step, the metal layer may be formed on the entire outermost-layer conductive circuit including the solder pads.

(10) Next, a coating film made of a silane coupling agent is formed on the above metal layer. Here, when forming a coating film, for example, a solution containing a silane coupling agent is sprayed and then dried. Preferably, a later-described solder resist layer and a silane coupling agent are selected in such a combination that the functional group of the solder resist layer will chemically react with the functional group of the silane coupling agent when heat is added. For example, when an epoxy group is contained in the solder resist layer, if an amino-functional silane is selected as the silane coupling agent, notable adhesiveness will be achieved between them. That is thought to be because an epoxy group and an amino group easily form a strong chemical bond when heat is added to form the solder resist layer, and such a bond is extremely stable against heat or water.

(11) Next, on the outermost interlayer resin insulation layer and solder pads, a solder resist layer is formed, while forming opening portions for solder bumps in the solder resist layer. Specifically, on the uppermost interlayer resin insulation layer including the conductive circuit, solder resist composition is applied using a roll coater method or the like, and then cured, while opening portions are formed by laser processing, by exposure and development or the like. Accordingly, a solder resist layer is formed with opening portions formed at its predetermined spots.

(12) Next, solder pads are exposed at the bottoms of the opening portions in the solder resist layer formed in step (11). When step (11) is completed, a metal layer is usually exposed at the bottoms of the opening portions. The metal layer is removed using an etching solution made from a nitric acid solution and hydrogen peroxide solution, or by wet blasting. Furthermore, when exposing solder pads at the bottoms of the opening portions in the solder resist layer using such methods, a desmear treatment to remove resin residue remaining in the opening portions formed in the solder resist layer may be conducted at the same time as the coating film and metal layer are removed.

Also, when forming opening portions in the solder resist layer by laser processing or by exposure and development or the like, and/or when removing the metal layer using an etching solution, wet blasting or the like, the coating film on the metal layer will be removed as well.

(13) Next, a protective film is formed on the solder pads exposed at the bottoms of the opening portions in the solder resist layer. Specifically, first, an Ni layer is formed on the solder pads by electroless nickel plating, then an Au layer is formed on the Ni layer by electroless gold plating. Accordingly, a protective film made of an Ni layer and an Au layer is formed.

(14) Lastly, solder bumps are formed to complete a multilayer printed wiring board. Specifically, solder paste is printed in the opening portions of the solder resist layer, and then a reflow process is conducted to form the solder bumps.

In the following, the effects of a multilayer printed wiring board and a method for manufacturing a multilayer printed wiring board according to the embodiment are listed.

(1) In a multilayer printed wiring board of the embodiment, a metal layer is formed on the surfaces of solder pads, and a coating film made of a silane coupling agent is further formed on the metal layer. Therefore, the solder pads and the solder resist layer will be firmly adhered by means of the metal layer and the coating film. At the same time, since the solder pads and the protective film on the solder pads are directly connected, the electric resistance between the solder pads and the protective film may decrease. To reduce the electric resistance between the solder pads and the protective film, it is preferred that the entire protective film be directly connected to the solder pads beneath it.

(2) In a multilayer printed wiring board of the embodiment, since a metal layer containing Sn is formed as the above metal layer, adhesiveness is enhanced between the solder pads and the solder resist layer by means of the metal layer and the coupling agent. The reason for this is described earlier.

(3) In a multilayer printed wiring board of the embodiment, the surfaces of solder pads are not roughened, but are substantially flat. Accordingly, signal transmission delays due to the skin effect seldom occur and thus the electrical characteristics are excellent.

(4) In a multilayer printed wiring board of the embodiment, solder pads are made up of electroless copper-plated film and electrolytic copper-plated film, and protective film is formed directly on the surface of the electrolytic copper-plated film that forms solder pads. Accordingly, the adhesiveness between the protective film and solder pads is ensured, while an increase in the electric resistance between the solder pads and the solder bumps is suppressed.

(5) The method for manufacturing a multilayer printed wiring board according to the embodiment is preferred to be used to manufacture a multilayer printed wiring board of the embodiment. In the multilayer printed wiring board of the embodiment, since the metal layer containing Sn is removed using an etching solution made from a nitric acid solution and hydrogen peroxide solution, or by wet blasting, the metal layer at the bottoms of opening portions formed in the solder resist layer may be removed completely. Also, by using the above methods, a desmear treatment may be conducted at the same time as the metal layer is removed so that the resin residue remaining when opening portions are formed in the solder resist layer may be removed.

In the following, the embodiment is further described with reference to examples. However, the embodiments of the present invention are not limited only to such examples.

Example 1

(A) Preparation of Resin Filler

The following were put in a container and mixed by blending them to prepare a resin filler with a viscosity of 45-49 Pa·s at 23±1° C.: bisphenole F-type epoxy monomer (YL983U, molecular weight=310, made by Japan Epoxy Resins Co., Ltd.) 100 parts by weight; $SiO_2$ spherical particles whose surfaces are coated with silane coupling agents, and whose average particle diameter is 1.6 μm and maximum particle diameter is 15 μm or smaller (CRS1101-CE made by Atotech Japan) 170 parts by weight; and a leveling agent (Perenol S4, made by San Nopco Limited) 1.5 parts by weight. As a curing agent, an imidazole curing agent (2E4MZ-CN, made by Shikoku Chemicals Corporation) 6.5 parts by weight was used.

Figure 2:
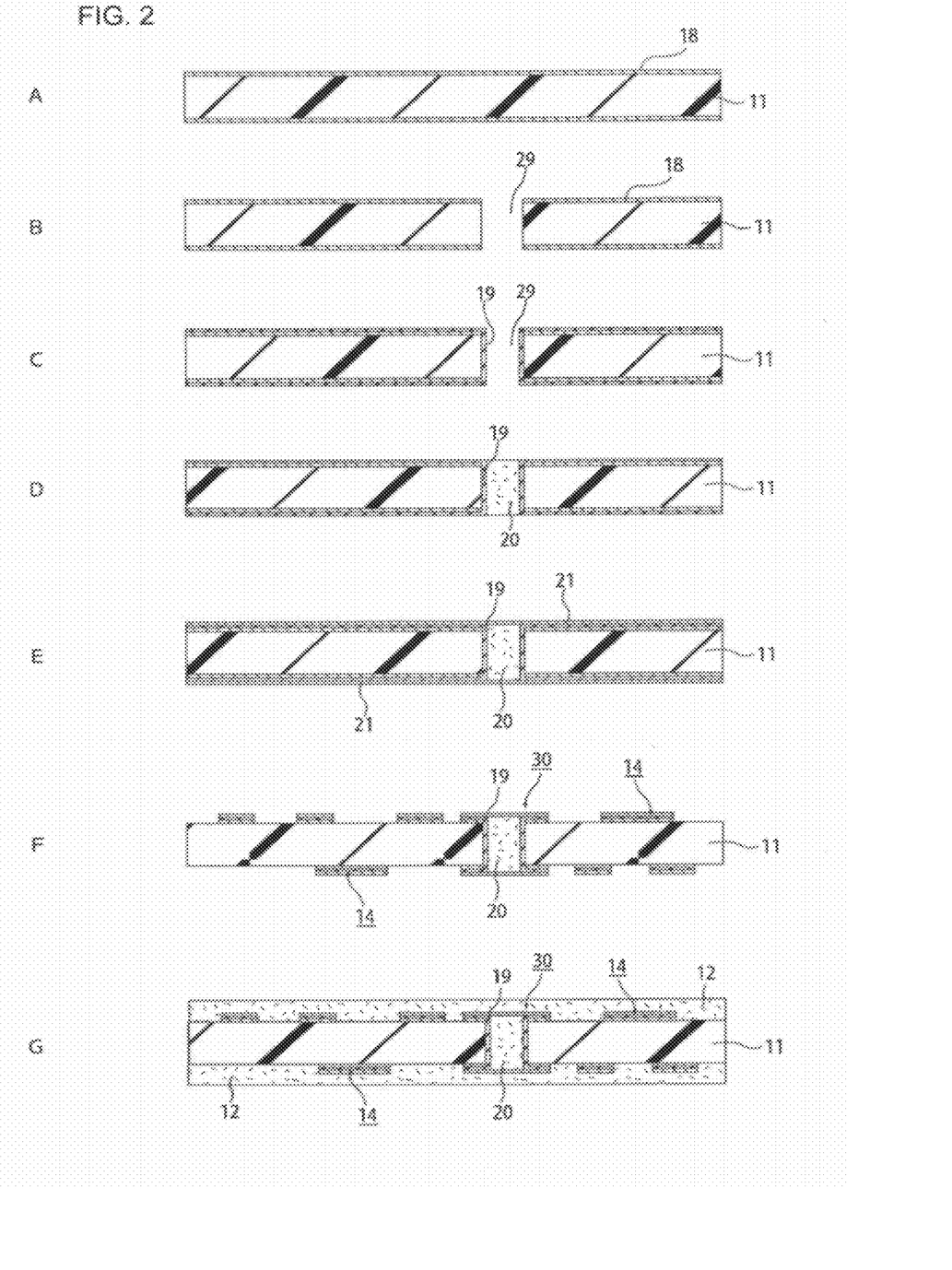
FIGS. 2A-2G are cross-sectional views schematically showing a method for manufacturing a multilayer printed wiring board of the embodiment.

(B) Manufacturing a Multilayer Printed Wiring Board (1) A copper-clad laminate shown in FIG. 2A, in which copper foil 18 with a thickness of 18 μm was laminated on both surfaces of insulative substrate 11 made of 0.8 mm-thick glass epoxy resin, was used as a starting material. Next, as shown in FIG. 2B, the copper-clad laminate was drilled to form penetrating holes 29 for through-hole conductors.

Next, as shown in FIG. 2C, on copper foil 18 and the inner-wall surfaces of penetrating holes 29, electroless copper plating and electrolytic copper plating were performed to form a conductive layer including through-hole conductors 19 which were made up of electroless copper-plated film and electrolytic copper-plated film on the electroless copper-plated film.

(2) Next, the substrate with through-hole conductors 19 was washed with water and dried. Then, a black oxide treatment was conducted using a solution as a black oxide bath (oxidation bath) which contains NaOH (10 g/L), $NaClO_2$ (40 g/L) and $Na_3PO_4$ (6 g/L), followed by a reduction treatment using a solution as a reduction bath which contains NaOH (10 g/L) and $NaBH_4$ (6 g/L). Accordingly, the surfaces of through-hole conductors (19) were roughened (not shown in the drawings).

(3) Next, as shown in FIG. 2D, the resin filler described in above (A) was filled inside through-hole conductors 19 under the following process. Namely, the resin filler was squeezed into through-hole conductors 19 using a squeegee, and dried under conditions of 100° C. for 20 minutes. Then, one side of the substrate was belt-sanded using a #600 belt polishing paper (made by Sankyo-Rikagaku Co., Ltd.) so that the resin filler does not remain on the electrolytic copper-plated film. Then, the substrate was buff-sanded to remove scratches by the above belt-sander polishing. Such a series of polishings was also conducted on the other surface of the substrate. Then, heat treatments were conducted at 100° C. for an hour, at 120° C. for three hours, at 150° C. for an hour, and at 180° C. for seven hours to form resin filler layers 20.

(4) Next, as shown in FIG. 2E, conductive layer 21 made up of electroless copper-plated film and electrolytic copper-plated film was formed on the electrolytic copper-plated film and on resin filler layers 20. Then, as shown in FIG. 2F, conductive circuit 14 was formed on insulative substrate 11 using a subtractive method. During that time, conductive circuit 30 covering resin filler layers 20 was also formed.

(5) Next, as shown in FIG. 2G, interlayer resin insulation layer 12 was formed on insulative substrate 11 and conductive circuit 14 using an interlayer resin insulation film (ABF, made by Ajinomoto Fine-Techno Co., Inc.). Namely, resin film for interlayer resin insulation layers was laminated on the substrate under the conditions of vacuum degree 65 Pa, pressure 0.4 MPa, temperature 80° C. and time 60 seconds, then cured at 170° C. for 30 minutes.

Figure 3:
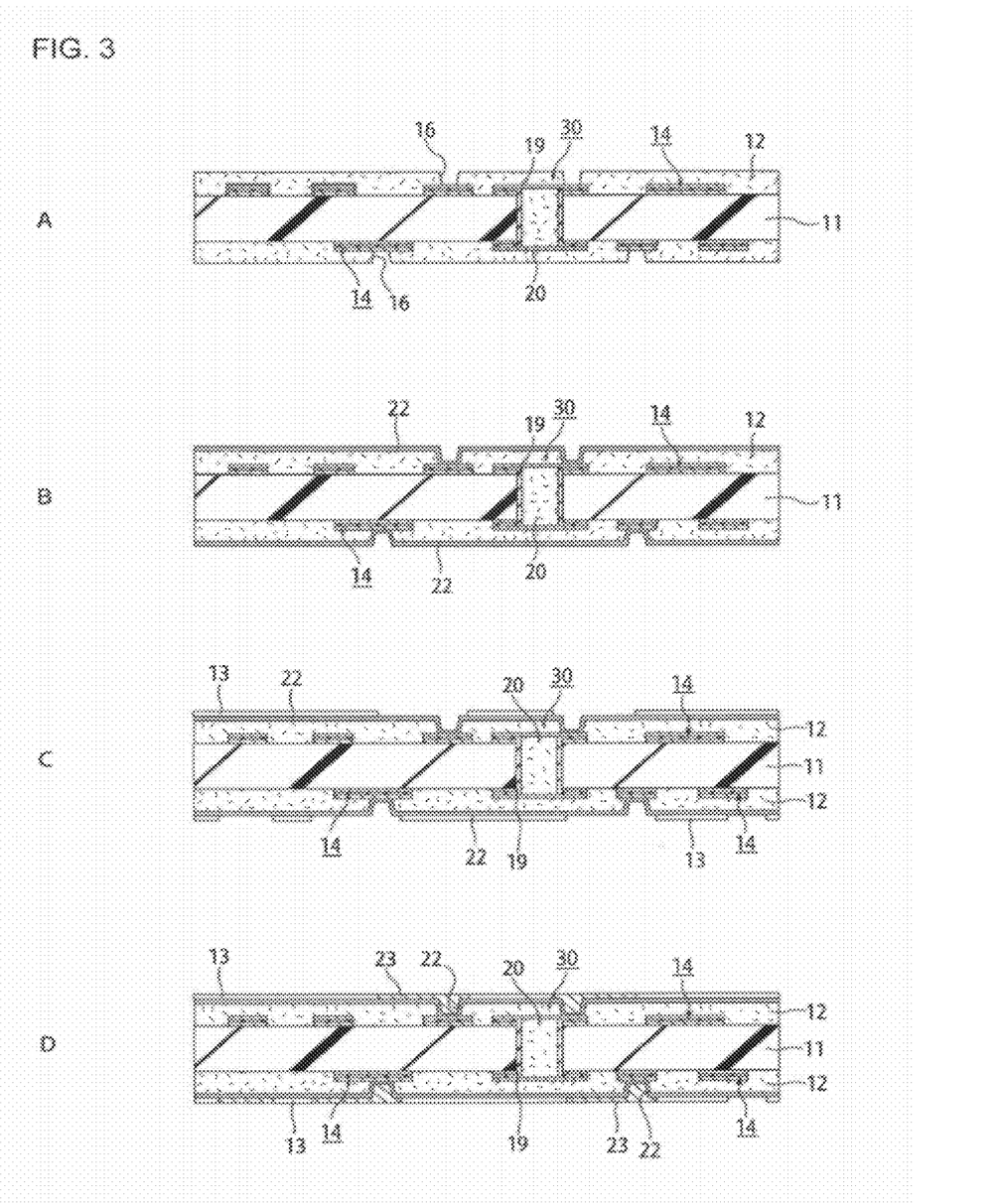
FIGS. 3A-3D are cross-sectional views schematically showing a method for manufacturing a multilayer printed wiring board of the embodiment.

(6) Next, opening portions 16 with a diameter of 60 μm were formed in interlayer resin insulation layer 12 using $CO_2$ gas laser (see FIG. 3A).

(7) Next, a palladium catalyst (not shown in the drawings) was applied to the surface of interlayer resin insulation layer 12 (including the inner-wall surfaces of opening portions 16). Then, the substrate with the palladium catalyst was immersed in an electroless copper plating solution (MF-390, made by Nippon MacDermid Co., Inc., Ltd.) using sodium hypophosphite as a reduction agent. Accordingly, electroless copper-plated film 22 with a thickness in the range of 0.1 to 0.3 μm was formed on the surface of interlayer resin insulation layer 12 (including the inner-wall surfaces of opening portions 16) (see FIG. 3B). The electroless copper plating conditions were solution temperature 75° C. and four minutes.

(8) Next, a commercially available photosensitive dry film was laminated on electroless copper-plated film 22, and a mask was placed thereon, which was then exposed and developed. Accordingly, plating resist 13 with a thickness of 25 μm was arranged (see FIG. 3C).

(9) Next, the substrate with plating resist 13 was washed with 50° C. water to remove grease, washed with 25° C. water and further washed with sulfuric acid. Then electrolytic plating was performed under the following conditions to form electrolytic copper-plated film 23 with a thickness of 20 μm in areas where plating resist 13 was not formed (see FIG. 3D).

| [electrolytic copper plating solution] | |
| --- | --- |
| sulfuric acid | 150 g/L |
| copper sulfate | 150 g/L |
| chloride ion | 8 mg/L |
| additives | 4 ml/L |
| Top Lucina NSV-1, made by Okuno Chemical Industries Co., Ltd.) | 0.5 ml/L |
| (Top Lucina NSV-2, made by Okuno Chemical Industries Co., Ltd.) | 1 ml/L |
| (Top Lucina NSV-3, made by Okuno Chemical Industries Co., Ltd.) | |
| [electrolytic plating conditions] | |
| current density | 1 A/dm$^2$ |
| time | 90 minutes |
| temperature | 23° C. |

Figure 4:
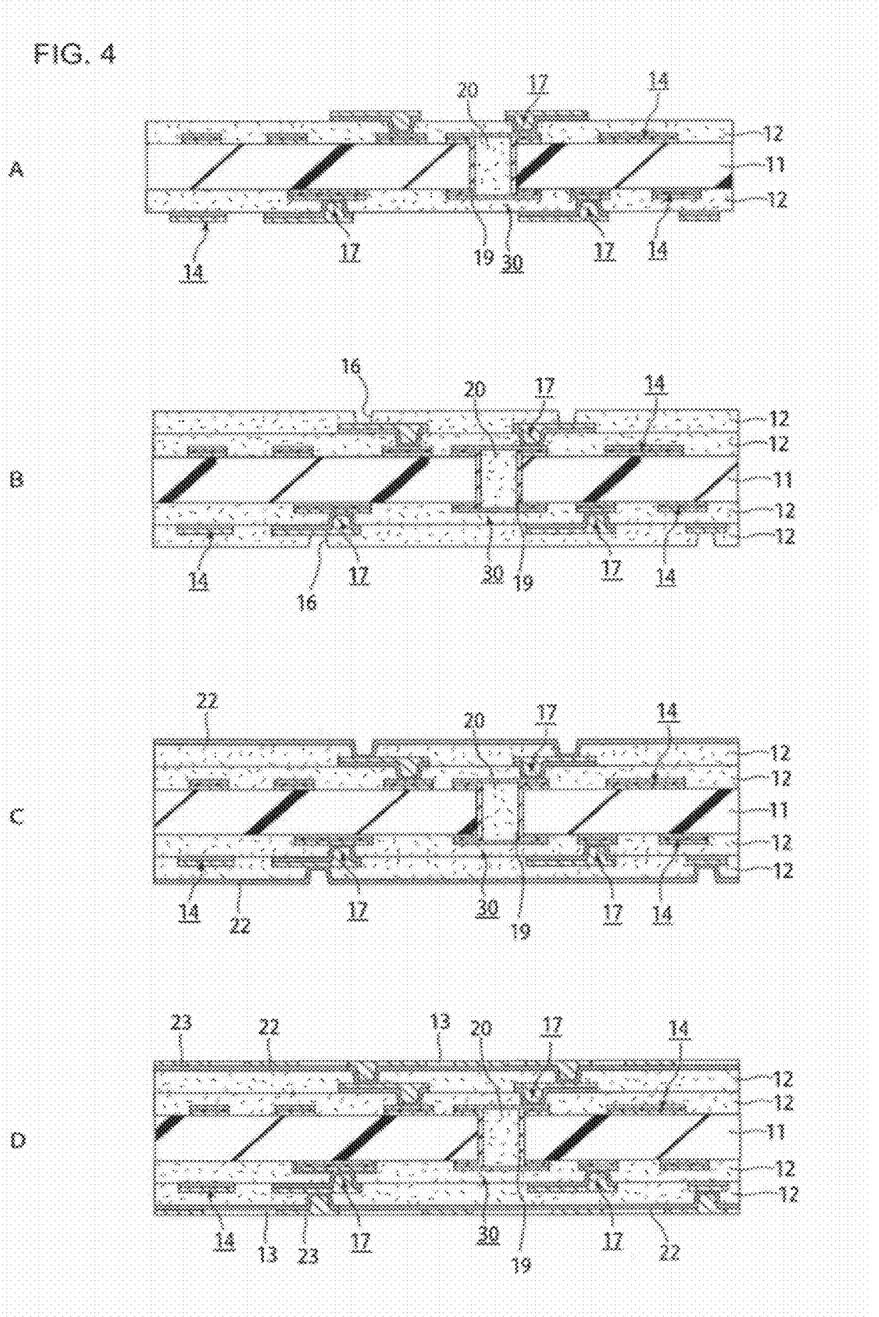
FIGS. 4A-4D are cross-sectional views schematically showing a method for manufacturing a multilayer printed wiring board of the embodiment.
Figure 5:
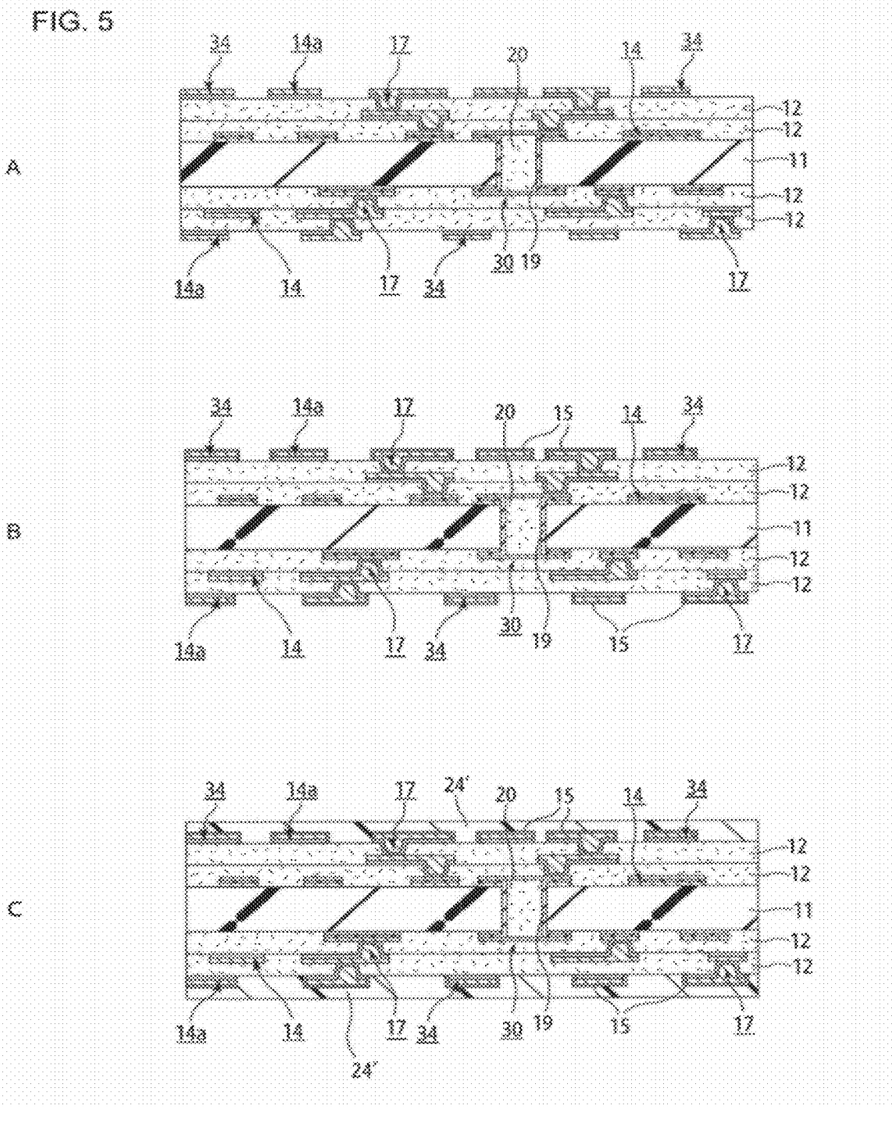
FIGS. 5A-5C are cross-sectional views schematically showing a method for manufacturing a multilayer printed wiring board of the embodiment.

(10) Next, plating resist 13 was removed. In the following, electroless copper-plated film 22 between adjacent portions of electrolytic copper-plated film was etched away using a mixed solution of sulfuric acid and hydrogen peroxide. In doing so, 18 μm-thick conductive circuit 14 and via conductors 17 were formed, which were made up of electroless copper-plated film 22 and electrolytic copper-plated film 23 formed on the electroless copper-plated film (see FIG. 4A).

(11) Next, conducting above steps (5)-(10), interlayer resin insulation layer 12 and conductive circuit 14 (including via conductors 17) were formed (see FIGS. 4B-5A). Parts of the conductive circuit formed here will become solder pads 34 in the later process.

(12) Next, the substrate with outermost-layer conductive circuit (14a) (including solder pads 34) was immersed in a 10% sulfuric acid solution for 10 seconds, washed with water, and dried without air flow.

(13) Next, the substrate was immersed in a tin displacement plating solution containing tin bistetrafluoroborate 0.1 mol/L and thiourea 1 mol/L with an adjusted pH of approximately 1.2 using fluoroboric acid, under the conditions of approximately 30° C. for about 30 seconds. Then, the substrate was washed with water for approximately 30 seconds, then dried without air flow. In such a plating treatment, an Sn—Cu layer and an Sn layer were formed in that order on the surface of outermost-layer conductive circuit (14a) (including solder pads 34). The thickness of the Sn—Cu layer was approximately in the range of 5 to 10 nm and that of the Sn layer was approximately 50 nm.

(14) Next, the substrate was immersed in a 1% nitric acid solution for 10 seconds, and washed with water for 20 seconds. By doing so, the Sn layer was removed and the Sn—Cu layer was exposed.

(15) Next, a solution of γ-amino propyltriethoxysilane (KBE-903, made by Shin-Etsu Chemical Co., Ltd.) with an adjusted concentration of 1 weight percent was sprayed on outermost-layer conductive circuit (14a) (on the Sn—Cu layer). Then, the substrate was dried at 90-120° C. for 30-150 seconds and washed with water to remove the excess silane coupling agent. In doing such steps (12)-(15), conductive-circuit coating layer 15, which was made up of a metal layer containing Sn and a silane coupling agent, was formed on outermost-layer conductive circuit (14a) (including solder pads 34) (see FIG. 5B).

(16) Next, as shown in FIG. 5C, on the outermost layer, a commercially available solder resist composition (7200G, made by Hitachi Chemical Co., Ltd.) was applied to be 30 μm thick and dried under the conditions of 70° C. for 20 minutes and 70° C. for 30 minutes. Accordingly, solder resist composition layer 24' made of a commercially available composition was formed.

Figure 6:
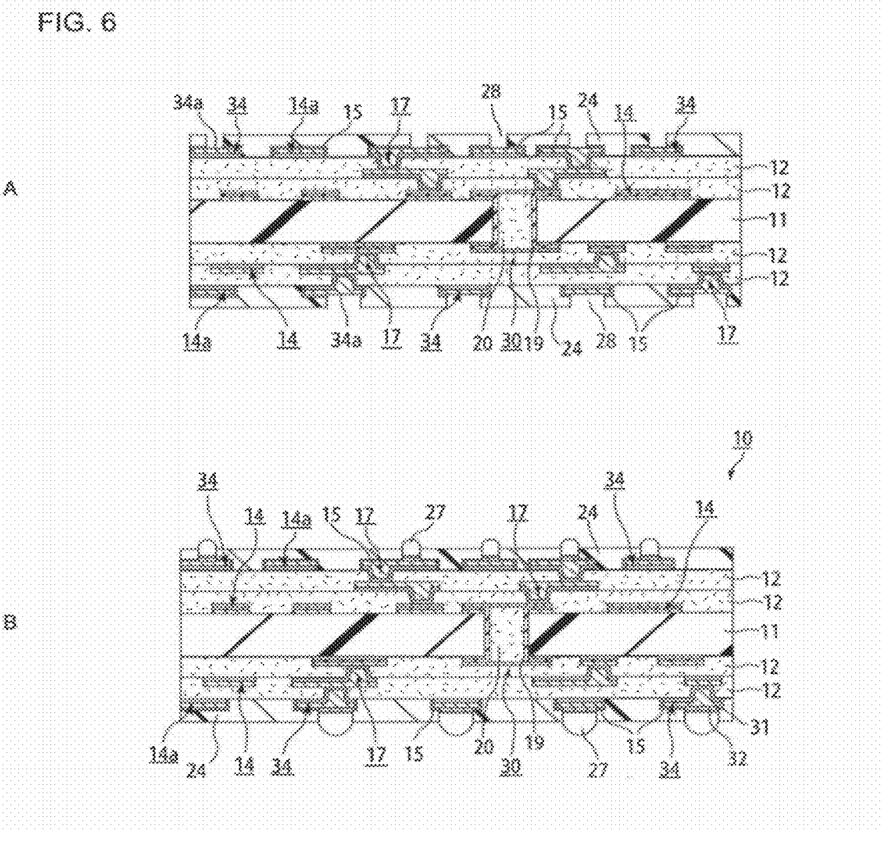
FIGS. 6A-6B are cross-sectional views schematically showing a method for manufacturing a multilayer printed wiring board of the embodiment.

(17) Next, as shown in FIG. 6A, a 5 mm-thick photomask with an opening pattern of solder bumps was adhered onto solder resist composition layer 24', which was then exposed to ultraviolet rays at 1000 mJ/cm$^2$ and developed in a DMTG solution. Accordingly, solder-bump openings 28 were formed. Furthermore, solder resist composition layer 24' was cured through heat treatments conducted under the conditions of 80° C. for an hour, 100° C. for an hour, 120° C. for an hour and 150° C. for three hours. Solder resist layer 24 (20 μm thick) having solder-bump openings 28 was formed.

(18) Next, in solder-bump openings 28, an etching solution containing a 15-20 weight percent nitric acid solution and 1-2 weight percent hydrogen peroxide solution was sprayed. By doing so, resin residue remaining in solder-bump openings 28 as well as the coating film made of a silane coupling agent and the Sn—Cu layer were removed. As a result, portions of solder pads 34 (exposed surfaces (34a)) were exposed at the bottoms of solder-bump openings 28.

Next, after step (18) was finished, the bottoms of the opening portions were observed using an SEM, its formation elements were analyzed, but no Sn peak was found. Therefore, the Sn—Cu layer was thought to be completely removed by the above treatment using an etching solution.

(19) Next, the substrate with solder resist layer 24 was immersed for 20 minutes in an electroless nickel plating solution of pH=4.5 containing nickel chloride ($2.3 \times 10^{-1}$ mol/L), sodium hypophosphite ($2.8 \times 10^{-1}$ mol/L), sodium citrate ($1.6 \times 10^{-1}$ mol/L), and a 5 μm-thick nickel-plated layer 31 was formed in solder-bump openings 28. Furthermore, the substrate was immersed for 7.5 minutes in an electroless gold plating solution at 80° C. containing gold potassium cyanide ($7.6 \times 10^{-3}$ mol/L), ammonium chloride ($1.9 \times 10^{-1}$ mol/L), sodium citrate ($1.2 \times 10^{-1}$ mol/L), sodium hypophosphite ($1.7 \times 10^{-1}$ mol/L), and a 0.03 μm-thick gold-plated layer 32 was formed on nickel-plated layer 31. They were altogether referred to as protective film 33.

(20) Next, solder paste was printed in solder-bump openings 28 formed in solder resist layer 24 and solder bumps 27 were formed through a reflow process at 200° C. Accordingly, multilayer printed wiring board 10 was completed (see FIG. 6B).

Example 2

In step (18) of Example 1, an etching solution was used to remove resin residue remaining in solder-bump openings 28 along with the coating film made of a silane coupling agent and the Sn—Cu layer. Instead, wet blasting was conducted under the following conditions. The rest was the same as in Example 1 and a multilayer printed wiring board was manufactured. Wet blasting was conducted under the conditions of a particle diameter of 7 μm (#2000), c/s=1.5 m/min. and pressure of 0.2 MPa.

Examples are listed below using a metal layer containing metals other than Sn.

Example 3

In Example 3, electroless Ni plating is performed instead of Sn displacement plating in Example 1, and an Ni layer is formed on the surfaces of outermost-layer conductive circuit (14a) (including solder pads 34). Then, above steps (15)-(20) are conducted.

Example 4

In Example 4, Pd displacement plating is performed instead of Sn displacement plating in Example 1. Namely, the substrate with outermost-layer conductive circuit (14a) (including solder pads 34) is immersed for a predetermined time in a Pd displacement plating bath to form a Pd layer. Then, above steps (15)-(20) are conducted.

Example 5

In Example 5, Au displacement plating is performed instead of Sn displacement plating in Example 1. Namely, the substrate with outermost-layer conductive circuit (14a) (including solder pads 34) is immersed for a predetermined time in an Au displacement plating bath to form an Au layer. Then, above steps (15)-(20) are conducted.

Example 6

In Example 6, electroless Ag plating is performed instead of Sn displacement plating in Example 1, and an Ag layer is formed on the surfaces of outermost-layer conductive circuit (14a) (including solder pads 34). Then, above steps (15)-(20) are conducted.

Example 7

In Example 7, electroless Pt plating is performed instead of Sn displacement plating in Example 1, and a Pt layer is formed on the surfaces of outermost-layer conductive circuit (14a) (including solder pads 34). Then, above steps (15)-(20) are conducted.

Example 8

In Example 8, Zn plating is performed instead of Sn displacement plating in Example 1, and a Zn layer is formed on the surfaces of outermost-layer conductive circuit (14a) (including solder pads 34). Then, above steps (15)-(20) are conducted.

Example 9

In Example 9, a Co layer is formed on the surfaces of outermost-layer conductive circuit (14a) (including solder pads 34) by sputtering instead of Sn displacement plating in Example 1. Then, above steps (15)-(20) are conducted.

Example 10

In Example 10, a Ti layer is formed on the surfaces of outermost-layer conductive circuit (14a) (including solder pads 34) by sputtering instead of Sn displacement plating in Example 1. Then, above steps (15)-(20) are conducted.

Comparative Example 1

A multilayer printed wiring board was manufactured in the same way as in Example 1, except that a metal layer containing Sn was not formed on the surfaces of the solder pads. Therefore, in the multilayer printed wiring board according to Comparative Example 1, solder pads 34 and solder resist layer 24 are connected without a metal layer but only through a coating film made of a silane coupling agent.

Comparative Example 2

A multilayer printed wiring board was manufactured in the same way as in Example 1, except that a coating film made of a silane coupling agent was not formed on the surfaces of the solder pads. Therefore, in the multilayer printed wiring board according to Comparative Example 2, a metal layer is formed on the surfaces of solder pads 34, and solder pads 34 and solder resist layer 24 are connected without a silane coupling agent.

Comparative Example 3

A multilayer printed wiring board was manufactured in the same way as in Example 1, except that a step to remove the metal layer exposed at the bottoms of the opening portions was not conducted after the opening portions were formed in the solder resist layer. Therefore, in the multilayer printed wiring board according to Comparative Example 3, solder pads 34 and protective film 33 are connected through a metal layer containing Sn.

Evaluation of Multilayer Printed Wiring Boards of Examples 1 and 2 and Comparative Examples 1 and 2

(1) Evaluation of Adhesiveness between Solder Pads and Solder Resist Layers Regarding multilayer printed wiring boards of Examples 1 and 2 and Comparative Examples 1 and 2, their peel strengths were measured at the initial stage and after humidity testing using the following method. The results are shown in Table 1.

<Initial Stage (Before Humidity Testing)>
Regarding multilayer printed wiring boards of Examples 1 and 2 and Comparative Examples 1 and 2, their peel strengths were measured before conducting humidity testing. Peel strengths were measured using Autograph AGS50A (made by Shimadzu Corporation). Interlayer resin insulation layers were peeled from conductive circuits at a speed of approximately 10 mm/min.

<After Humidity Testing>
Regarding multilayer printed wiring boards of Examples 1 and 2 and Comparative Examples 1 and 2, their peel strengths were measured the same as above after each printed wiring board was held for 100 hours under the conditions of 120-130° C. with humidity 85%.

TABLE 1

| | peel strength (N/cm) | |
| --- | --- | --- |
| | initial stage | after humidity testing |
| Example 1 | 11.86 | 8.33 |
| Example 2 | 11.86 | 8.33 |
| Comp. Example 1 | 7.84 | 0 |
| Comp. Example 2 | 5.88 | 0 |

As shown in Table 1, excellent peel strength was not found in Comparative Example 1 where a coupling agent was directly applied to the surface of Cu, which forms solder pads. Also, in Comparative Example 2 where an Sn—Cu alloy was connected to a solder resist layer without applying a coupling agent between them, excellent peel strength was not found. Also, it was found that there was no adhesion between them after humidity testing. By contrast, in Examples 1 and 2 where an Sn—Cu alloy was formed on the surfaces of solder pads to be connected to a solder resist layer through a coupling agent, excellent peel strength was found due to the combined effects of the Sn—Cu alloy and the coupling agent.

(2) Evaluation of Adhesiveness between Solder Pads and Solder Bumps Regarding multilayer printed wiring boards of Examples 1 and 2 and Comparative Example 3, adhesiveness of solder bumps to solder pads was evaluated using the following method. Namely, regarding multilayer printed wiring boards of Examples 1 and 2 and Comparative Example 3, a process was repeated 200 times in which each printed wiring board was kept for 19 hours under conditions of 55° C. and humidity of 85%, then the temperature was raised to 260° C. Then, multilayer printed wiring boards were cross-cut to observe through a microscope the connected sections between solder pads and solder bumps. As a result, in Examples 1 and 2, solder bumps were securely connected to the surfaces of the solder pads and no peeling from the solder pads was found in the solder bumps. On the other hand, in Comparative Example 3, peeling from the solder pads was found in the solder bumps.

Other Examples

In the above embodiment, a metal layer containing Sn is used as a metal layer to be formed on parts of the side and top surfaces of the solder pads. However, in a multilayer printed wiring board according to the embodiment of the present invention, the material for such a metal layer is not limited to those containing Sn, but any metal layer may be used as long as it contains at least one metal from among Sn, Ni, Zn, Co, Ti, Pd, Ag, Pt and Au. That is because such metals show better adhesiveness with coupling agents than Cu. However, among those, a metal layer containing Sn is preferred. That is because, as described earlier, such a metal easily adheres hydroxyl groups to its surface, and thus adhesiveness with coupling agents is excellent.

Also, in the above embodiments, as for a coupling agent that forms a coating film, a silane coupling agent is employed. However, in multilayer printed wiring boards according to the embodiment of the present invention, a coupling agent is not limited to silane coupling agents, but for example, aluminate-type coupling agents, titanate-type coupling agents, zirconium-type coupling agents or the like may also be used.

Furthermore, the silane coupling agent is selected considering the material for the solder resist layers. For example, if a resin composition containing epoxy resin is used for the solder resist composition, it is preferred to select a silane coupling agent which has an amino group as its organic functional group. With such a combination, it is easier to firmly bond the solder resist layer and the silane coupling agent.

As for the solder resist composition, for example, a solder resist composition made from polyphenylene ether resin, polyorephine resin, fluorocarbon resin, thermoplastic elastomer, epoxy resin, polyimide resin or the like may be listed. In addition, other than the above, the following may be listed for solder-resist compositions: novolac type epoxy(meth) acrylate resin, imidazole curing agents, bifunctional (meth) acrylic ester monomers, methacrylate ester polymers with a molecule weight in the range of 500-5,000, thermosetting resins such as bisphenol epoxy resin, photosensitive monomers such as polyvalent acrylic monomers, and paste fluids containing glycol ether solvents. Also, when forming a layer from a solder resist composition, such solder resist layer may be formed by pressure-pressing a film made of a solder resist composition such as above.

In the above examples, an etching solution made from a nitric acid solution and hydrogen peroxide solution was used as an etching solution to expose solder pads at the bottoms of opening portions formed in a solder resist layer by removing a metal layer and coating film. However, other than such, for example, a permanganic acid solution or the like may be used.

In the above examples, a two-layer protective film made with an Ni layer and an Au layer was formed. However, the total number of layers in the protective film is not limited to two, but a single layer or three or more layers may also be formed. Also, the material for such protective layers, for example, Ni, Au, Pd, or a compound of such metals may be employed.

Also, when opening portions are formed in the solder resist layers through laser processing, as a laser to be used in such laser processing, for example, carbon dioxide gas laser, ultraviolet laser, excimer laser or the like may be listed.

In a multilayer printed wiring board according to the embodiment, the total number of interlayer resin insulation layers formed on both surfaces of an insulative substrate is the same. However, the number of layers on either side of the insulative substrate may be different.

Also, the above metal layers may be formed using sputtering.

A predetermined metal film is formed on the surfaces of pads for mounting an electronic component, and a coating film made of a coupling agent is formed on the metal film, and at least part of the protective film to protect the pads is connected directly to the pads. Thus, an increase in electric resistance between the pads and solder bumps is prevented, while ensuring the adhesiveness between the pads and the solder resist layer.

A multilayer printed wiring board according to an embodiment of the present invention includes: a first interlayer resin insulation layer; a pad for mounting an electronic component formed on the first interlayer resin insulation layer; a solder resist layer formed on the first interlayer resin insulation layer and the pad, and having an opening portion that reaches the pad; and a protective film positioned at the bottom of the opening portion and formed on the pad. In such a multilayer printed wiring board, a metal layer is formed on the surface of the pad, containing at least one metal from among Sn, Ni, Zn, Co, Ti, Pd, Ag, Pt and Au, a coating film made of a coupling agent is formed on the metal layer, and at least part of the protective film is formed directly on the exposed surface of the pad, which is exposed through the opening portion.

A method for manufacturing a multilayer printed wiring board according to another embodiment of the present invention includes: a step to form multiple wiring layers formed by alternately laminating interlayer resin insulation layers and conductive circuits, and further having a pad for mounting an electronic component on the outermost interlayer resin insulation layer; a step to form on at least part of the surface of the pad a metal layer containing at least one metal from among Sn, Ni, Zn, Co, Ti, Pd, Ag, Pt and Au; a step to form a coating film made of a coupling agent on the metal layer; a step to form a solder resist layer on the outermost interlayer resin insulation layer and the pad, while forming an opening portion in the solder resist layer that is positioned at a spot on the pad and penetrates the solder resist layer; a step to remove the metal layer that is exposed through the opening portion; and a step to form a protective film on the pad which is exposed at the bottom of the opening portion.

In a multilayer printed wiring board according to an embodiment of the present invention, on the surfaces of a pad for mounting an electronic component, a metal layer is formed containing at least one metal from among Sn, Ni, Zn, Co, Ti, Pd, Ag, Pt and Au, and a coating film made of a coupling agent is further formed on the metal layer. Therefore, the adhesiveness between the pad and the solder resist layer is excellent. Also, since at least part of the protective film is directly connected to the pad, the adhesiveness between the protective film and the pad is excellent. Furthermore, the electric resistance between the pad and the protective film is low, and the board has excellent electrical characteristics.

In addition, in a method for manufacturing a multilayer printed wiring board according to another embodiment of the present invention, a metal layer containing at least one metal from among Sn, Ni, Zn, Co, Ti, Pd, Ag, Pt and Au is formed on at least part of the surfaces of a pad for mounting an electronic component, and a coating film made of a coupling agent is formed on the metal layer. Also, when forming a protective film, after an opening portion is formed in the solder resist layer and a pad is exposed at the bottom of the opening portion, a protective film is formed. Accordingly, a multilayer printed wiring board may be manufactured with excellent electrical characteristics along with excellent adhesiveness between the pad and the solder resist layer.

Obviously, numerous modifications and variations of the present invention are possible in light of the above teachings. It is therefore to be understood that within the scope of the appended claims, the invention may be practiced otherwise than as specifically described herein.

What is claimed is:

1. A multilayer printed wiring board comprising:
    a first interlayer resin insulation layer;
    a pad formed on the first interlayer resin insulation layer and configured to mount an electronic component;
    a solder resist layer formed on the first interlayer resin insulation layer and the pad, the solder resist layer having an opening portion exposing a portion of the pad;
    a protective film formed on the portion of the pad exposed by the opening portion of the solder resist layer; and
    a coating layer comprising a metal layer and a coating film and formed between the pad and the solder resist layer, the metal layer being formed on a surface of the pad and the coating film being formed on the metal layer,
    wherein at least a portion of the protective film is formed directly on a surface of the portion of the pad exposed by the opening portion of the solder resist layer.

2. The multilayer printed wiring board according to claim 1, wherein the protective film is entirely positioned in the portion of the pad exposed by the opening portion of the solder resist layer.

3. The multilayer printed wiring board according to claim 1, wherein the pad comprises an electroless plated film formed on the interlayer resin insulation layer and an electrolytic plated film formed on the electroless plated film, and the protective film is formed on a surface of the electrolytic plated film of the pad.

4. The multilayer printed wiring board according to claim 1, wherein the protective film comprises an Ni layer formed on the pad and an Au layer formed on the Ni layer, and the Ni layer is formed directly on a surface of the portion of the pad exposed by the opening portion of the solder resist layer.

5. The multilayer printed wiring board according to claim 1, wherein the metal layer comprises a metal whose oxide has an isoelectric point of 5 or less.

6. The multilayer printed wiring board according to claim 1, wherein the metal layer comprises Sn.

7. The multilayer printed wiring board according to claim 1, wherein the pad has a surface which is formed substantially flat.

8. The multilayer printed wiring board according to claim 1, further comprising a solder member formed on the protective film.

9. The multilayer printed wiring board according to claim 1, wherein the metal layer comprises at least one metal selected from the group consisting of Sn, Ni, Zn, Co, Ti, Pd, Ag, Pt and Au.

10. The multilayer printed wiring board according to claim 1, wherein the coating film comprises a coupling agent.

11. The multilayer printed wiring board according to claim 1, wherein the metal layer comprises at least one metal selected from the group consisting of Sn, Ni, Zn, Co, Ti, Pd, Ag, Pt and Au, and the coating film comprises a coupling agent.

12. A method for manufacturing a multilayer printed wiring board, comprising:
    forming a plurality of interlayer resin insulation layers and a plurality of conductive circuits formed on the interlayer resin insulation layers, the plurality of interlayer resin insulation layers including an outermost interlayer resin insulation layer;
    forming a pad configured to mount an electronic component on the outermost interlayer resin insulation layer;
    forming on the pad a coating layer which comprising a metal layer and a coating film, the metal layer being formed on a surface of the pad, the coating film being formed on the metal layer;
    forming a solder resist layer on the outermost interlayer resin insulation layer and the pad;
    forming an opening portion in the solder resist layer exposing a portion of the pad coated with the coating layer;
    removing a portion of the coating layer exposed by the opening portion of the solder resist layer; and
    forming a protective film on the portion of the pad exposed by the opening portion of the solder resist layer such that at least a portion of the protective film is formed directly on a surface of the portion of the pad exposed by the opening portion of the solder resist layer.

13. The method for manufacturing a multilayer printed wiring board according to claim 12, wherein the removing of the coating layer comprises etching the portion of the coating layer with an etching solution to expose the portion of the pad.

14. The method for manufacturing a multilayer printed wiring board according to claim 12, wherein the removing of the coating layer comprising wet blasting the portion of the coating layer to expose the portion of the pad.

15. The method for manufacturing a multilayer printed wiring board according to claim 12, wherein the forming of the coating layer comprises plating Sn to form the metal layer comprising Sn plating on a surface of the portion of the pad exposed by the opening portion of the solder resist layer.

16. The method for manufacturing a multilayer printed wiring board according to claim 12, wherein the forming of the coating layer comprises forming the metal layer on an entire surface of the pad over the outermost interlayer resin insulation layer.

17. The method for manufacturing a multilayer printed wiring board according to claim 12, wherein the metal layer comprises at least one metal selected from the group consisting of Sn, Ni, Zn, Co, Ti, Pd, Ag, Pt and Au.

18. The method for manufacturing a multilayer printed wiring board according to claim 12, wherein the coating film comprises a coupling agent.

19. The method for manufacturing a multilayer printed wiring board according to claim 12, wherein the metal layer comprises at least one metal selected from the group consisting of Sn, Ni, Zn, Co, Ti, Pd, Ag, Pt and Au, and the coating film comprises a coupling agent.

20. The method for manufacturing a multilayer printed wiring board according to claim 12, wherein the forming of the protective film comprises positioning the protective film entirely in the portion of the pad exposed by the opening portion of the solder resist layer.

* * * * *